(12) United States Patent
Dorfman et al.

(10) Patent No.: US 7,552,040 B2
(45) Date of Patent: Jun. 23, 2009

(54) METHOD AND SYSTEM FOR MODELING LOGICAL CIRCUIT BLOCKS INCLUDING TRANSISTOR GATE CAPACITANCE LOADING EFFECTS

(75) Inventors: Barry Lee Dorfman, Austin, TX (US); Thomas Edward Rosser, Austin, TX (US); Jeffrey Paul Soreff, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1224 days.

(21) Appl. No.: 10/366,439

(22) Filed: Feb. 13, 2003

(65) Prior Publication Data

US 2004/0162716 A1     Aug. 19, 2004

(51) Int. Cl.
     *G06F 17/50*      (2006.01)
(52) U.S. Cl. .............................. 703/13; 703/14; 703/19; 703/21; 703/22; 716/1; 716/6; 714/741; 714/742
(58) Field of Classification Search .................. 703/14, 703/15, 19, 2, 13, 21, 22; 716/1, 6; 714/741, 714/742
See application file for complete search history.

(56) References Cited

U.S. PATENT DOCUMENTS

| | | | | |
|---|---|---|---|---|
| 5,317,206 | A * | 5/1994 | Hanibuchi et al. | 326/21 |
| 5,371,420 | A * | 12/1994 | Nakao | 326/27 |
| 5,787,008 | A * | 7/1998 | Pullela et al. | 703/19 |
| 5,942,917 | A * | 8/1999 | Chappell et al. | 326/121 |
| 6,353,917 | B1 * | 3/2002 | Muddu et al. | 716/6 |
| 6,377,129 | B1 * | 4/2002 | Rhee et al. | 331/111 |
| 6,408,425 | B1 * | 6/2002 | Mizutani | 716/5 |
| 6,463,567 | B1 * | 10/2002 | Kozai | 716/2 |
| 6,502,223 | B1 * | 12/2002 | Keller et al. | 716/5 |
| 6,528,972 | B2 * | 3/2003 | Yang | 320/163 |
| 6,601,223 | B1 * | 7/2003 | Puri et al. | 716/6 |
| 6,678,869 | B2 * | 1/2004 | Ohkubo | 716/6 |

(Continued)

OTHER PUBLICATIONS

J. Qian, S. Pullela, and L. Pillage, "Modeling the "Effective Capacitance" for the RC Interconnect of CMOS Gates", IEEE Transaction on Computer-Aided Design of Integrated Circuits and Systems, vol. 13, No. 12, Dec. 1994, pp. 1526-1535.*

(Continued)

*Primary Examiner*—Kamini S Shah
*Assistant Examiner*—Kibrom K Gebresilassie
(74) *Attorney, Agent, or Firm*—Mitch Harris, Atty at Law, LLC; Andrew M. Harris; Matthew W. Baca

(57) ABSTRACT

A method and system for modeling logical circuit blocks including transistor gate capacitance loading effects provides improved simulation of logical circuit block transition times and delay times. The non-linear behavior of transistor gates of other logical circuit block inputs that are connected to the logical circuit block output is taken into account by a transition time function and a delay time function that are each separately dependent on static capacitance and transistor gate capacitance and can be used to determine logical circuit block timing and output performance. A separate N-channel and P-channel gate capacitance may also be used as inputs to the transition time and delay time functions to provide further improvement, or a ratio of N-channel to P-channel capacitances may alternatively be used as input to the transition time and delay time functions.

5 Claims, 4 Drawing Sheets

U.S. PATENT DOCUMENTS

| | | | |
|---|---|---|---|
| 6,845,348 B1* | 1/2005 | Subbarao et al. | 703/2 |
| 7,194,716 B2* | 3/2007 | Croix | 716/6 |
| 7,283,942 B1* | 10/2007 | Lewis | 703/14 |
| 7,333,924 B1* | 2/2008 | Dastidar et al. | 703/2 |
| 2002/0021135 A1* | 2/2002 | Li et al. | 324/677 |
| 2002/0109535 A1* | 8/2002 | Caliboso | 327/143 |
| 2002/0124230 A1* | 9/2002 | Cai et al. | 716/6 |
| 2003/0149555 A1* | 8/2003 | Sonoda | 703/15 |
| 2004/0125521 A1* | 7/2004 | Salling et al. | 361/56 |
| 2004/0243952 A1* | 12/2004 | Croix | 716/4 |

OTHER PUBLICATIONS

Y. Yoshida, H. Watanabe, K. Shibata, A. Takemoto, and H. Higuchi, "Analysis of Characteristic Temperature for INGaAsP BH Lasers with p-n-p-n Blocking Layers Using Two-Dimensional Device Simulator" IEEE Journal of Quantum Electronics, vol. 34, No. 7, Jul. 1998, pp. 1257-1262.*

J. Qian, S. Pullela, and L. Pillage, "Modeling the "Effective Capacitance" for the RC Interconnect of CMOS Gates", IEEE Transaction on Computer-Aided Design of Integrated Circuits and Systems, vol. 13, No. 12, Dec. 1994.*

A. Pardo, R. I. Bahar, S. Manne, P. Feldman, G. D. Hachtel, and F. Somenzi, "CMOS Dynamic Power based on Collapsible Current Source Transistor Modeling". pp. 1-6. PDF file Created on Nov. 17, 1995.*

A. S. Sedra, K. C. Smith, "Microelectronic Circuits" Forth Edition, 1998, pp. 432-434.*

N. H. E. Weste, and K. Eshraghian, "Principle of CMOS VLSI Design-A Systems Perspective", second Edition, 1993, 88 pages.*

G. Blum, "current Simulation for CMOS Circuits," Carnegie Mellon, Department of Electrical and Computer Engineering, 1992, pp. 1-22.*

* cited by examiner

METHOD AND SYSTEM FOR MODELING LOGICAL CIRCUIT BLOCKS INCLUDING TRANSISTOR GATE CAPACITANCE LOADING EFFECTS

CROSS-REFERENCE TO RELATED APPLICATIONS

The present invention is related to application Ser. No. 10/268,235, filed Oct. 10, 2002 now abandoned and entitled "METHOD AND SYSTEM FOR MODELING OF EFFECTIVE CAPACITANCE IN LOGIC CIRCUITS". The above-referenced application is assigned to the same assignee.

BACKGROUND OF THE INVENTION

1. Field of the Invention

The present invention is related to circuit modeling methods and software, and more particularly to logic circuit modeling methods and software that compute loading effects on logical circuit block signal performance.

2. Description of Related Art

Circuit modeling methods, typically implemented in software tools that simulate the performance of circuits for design verification provide a mechanism for optimizing and ensuring proper performance of Integrated Circuits (IC) including Very-Large-Scale Integrated (VLSI) circuits. Logical circuits are typically represented as circuit blocks having a modeled response to input state changes. In response to an input change, a delay time and a transition time are generally used to generate the output voltage of the logical circuit block within the model.

The transition time and delay time of a logical circuit block vary over various parameters of the circuit block, such as output transistor size, power supply voltage and temperature. The transition time and delay time may also be modeled in terms of input voltage swing and transition time. Existing models take all or some of the above factors into account in order to determine the output signal produced by a logical circuit block.

Additionally, output loading characteristics have a large effect on the output signal and various techniques have been developed within present circuit models and modeling software to take loading effects into account. The simplest model used in present simulation tools is a lumped capacitance coupled to the output of the logical circuit block. The lumped capacitance represents all of the loading capacitance connected to the output of the logical circuit block, and may in the simplest case be equal to all of the capacitance connected to the logical circuit block output, or may be a capacitance value determined by sophisticated models of the interconnect resistance and capacitances at various points in the circuits connected to the output of the logical circuit block.

The above-referenced patent application describes a pi-network model that includes two capacitors determined from distributed capacitances connected to the output of a logical circuit block, along with the effects of the wire resistances connecting the capacitances. The pi-network model provides an improved calculation of the effects of distributed capacitances connected to the output of the logical circuit block.

However, present circuit models have progressively reduced accuracy as the logical circuit block output loading capacitance becomes dominated by transistor gate capacitances. Since the load on the output of a logical circuit block is typically at least one logical gate input connected via a typically low-resistance interconnect, the transistor gate capacitance, which is not in actuality a linear capacitance but a non-linear capacitance that varies with output signal voltage, has a significant impact on the logical circuit block transition time and delay time. The non-linear nature of the loading gate capacitances causes the transition time and delay time to diverge from values predicted by a simple capacitive model, making a simple shunt capacitance load model or fixed capacitive network load model ineffective for predicting both the transition time and delay time of a logical circuit block.

However, modeling gate capacitance loading effects on a circuit output is a complicated simulation task, as logical circuit block performance must be modeled over the complete range of device sizes that are encountered in actual designs. Transistor device size (and hence gate capacitance) is typically a static value in designs simulated by circuit simulation tools such as SPICE.

Therefore, it would be desirable to provide modeling methods and modeling software that accurately predict the performance of a logical circuit block as the logical circuit block output load varies between predominantly transistor gate capacitance and predominantly wire capacitance. It would further be desirable to predict non-linear effects of logical circuit block loading on logical circuit block transition time and delay time. It would further be desirable to provide a method for determining characteristics of the logical circuit block without having to model the logical circuit block over loading circuit transistor device size changes.

SUMMARY OF THE INVENTION

The above objectives of accurately predicting the performance of a logical circuit block as the logical circuit block output load varies between predominantly transistor gate capacitance and predominantly wire capacitance and predicting non-linear effects of logical circuit block loading on logical circuit block transition time and delay time are accomplished in a method for modeling logical circuit block behavior.

The method may be embodied in a computer system executing program instructions for carrying out the steps of the method and may further be embodied in a computer program product containing program instructions in computer-readable form for carrying out the steps of the method.

The method computes a transition time of a logical circuit block output as a first mathematical function of transistor gate capacitance connected to the output of the logical circuit block and a delay time as a second mathematical function of the transistor gate capacitance. The first and second functions may also include dependence on N-channel and P-channel gate capacitances separately or dependence on a N-channel to P-channel capacitance ratio. The first and second functions also include dependence on a "static capacitance", a term used here to represent wire and pin capacitances, etc. that are linear, separate from the transistor gate capacitance.

The method also includes a technique for determining the effects of gate capacitance loading on transition times and delay times to determine coefficients of the first and second mathematical functions above. A logical circuit block output including loading transistor(s) and a variable static capacitance are simulated using a circuit simulation tool such as SPICE. A current controlled current source is used to shunt output current in response to a measured current entering the loading transistor(s), providing a means for changing the apparent size of (or effectively removing) the transistors from the model without changing transistor device sizes.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

Figure 1:
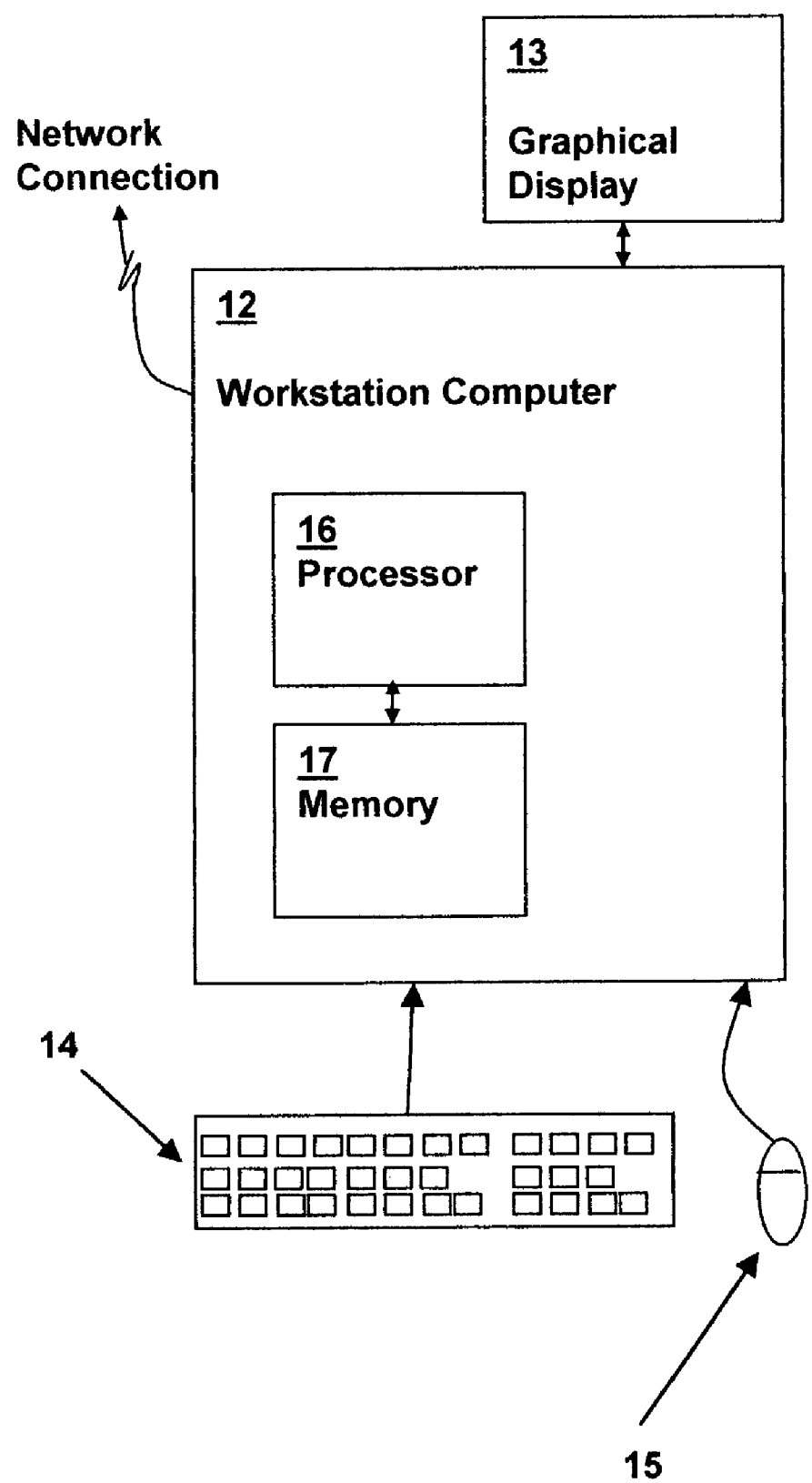
FIG. 1 is a pictorial diagram of a workstation computer system in which methods in accordance with an embodiment of the present invention are performed.

Referring to the figures, and particularly to FIG. 1, a workstation computer system, in which methods according to an embodiment of the present invention are performed, is depicted. A workstation computer 12, having a processor 16 coupled to a memory 17, for executing program instructions from memory 17, wherein the program instructions include program instructions for executing one or more methods in accordance with an embodiment of the present invention.

Workstation computer 12 is coupled to a graphical display 13 for displaying program output such as simulation results and circuit structure input and verification programs implementing embodiments of the present invention. Workstation computer 12 is further coupled to input devices such as a mouse 15 and a keyboard 14 for receiving user input. Workstation computer may be coupled to a public network such as the Internet, or may be coupled to a private network such as the various "intra-nets", or may not be connected to any network at all, and software containing program instructions embodying methods in accordance with embodiments of the present invention may be located on remote computers or locally within workstation computer 12.

Figure 2:
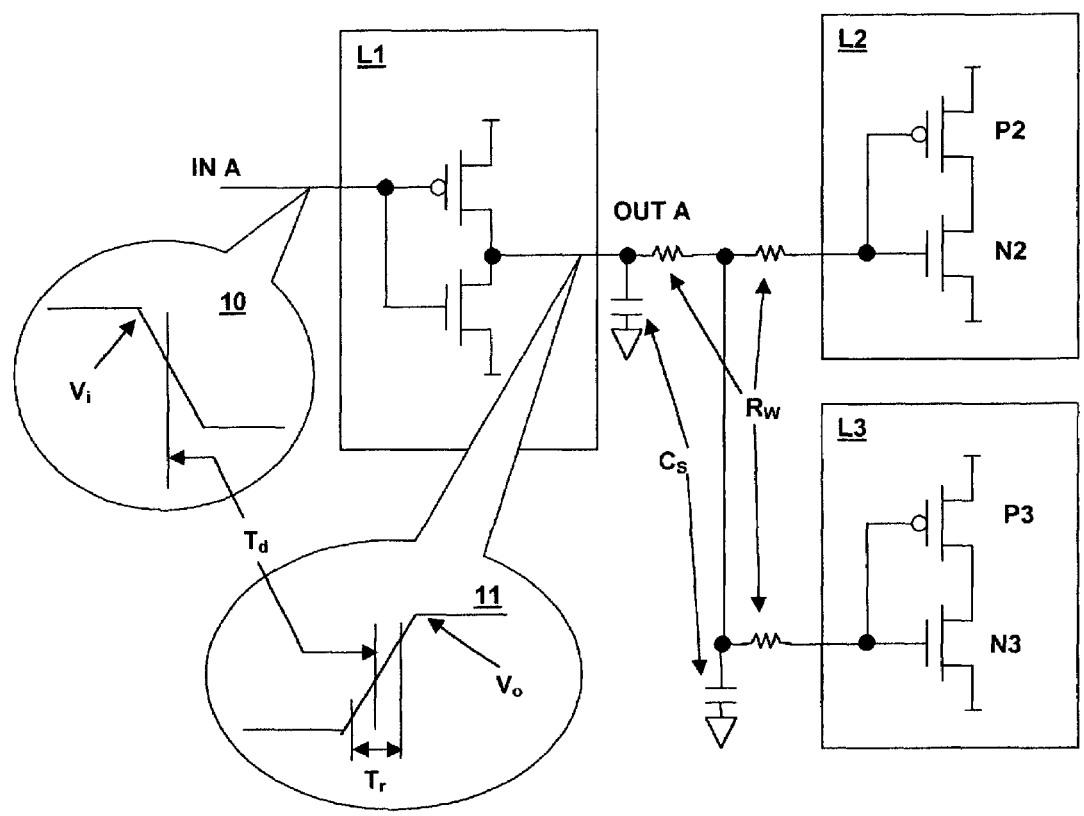
FIG. 2 is a schematic diagram of a portion of a logical integrated circuit model in accordance with an embodiment of the present invention.

Referring now to FIG. 2, a portion of an integrated circuit is depicted to illustrate a model in accordance with an embodiment of the present invention. Logic block L1 is simulated to produce an output voltage waveform $V_o$ (shown in balloon 11), calculated according to the illustrated model as a response to input voltage waveform $V_i$ (shown in balloon 10). The illustrated model uses a delay time $T_d$ and transition time $T_r$ to determine a linear voltage response to $V_i$. The 50% voltage point of output signal $V_o$ is set at interval $T_d$ after the 50% voltage point of input signal $V_i$ and the transition time $T_r$ determines the slope of output voltage waveform $V_o$. While this linear waveform model is of a type in common use and is sufficient to illustrate the techniques of the present invention, the model of the present invention may be used with other types of waveform modeling including higher-order waveshape models or piecewise linear models that compute an output waveform using calculations performed on sampled input voltage waveform points.

All of the illustrations and formulations in the following description are directed toward a rising transition time and a delay time. Actual models will generally include separate falling transition times and may include two or more delay times—for falling edges, rising edges and the various transfer functions of the circuit. The model of the present invention is equally applicable to rising transition time and falling transition time modeling either separately computed or provided by one formula and it should be understood that they can be used interchangeably with respect to the discussion hereinafter, excepting the actions of transistors described with respect to a particular signal edge, etc.

The model of the present invention provides the mathematical functions that calculate $T_r$ and $T_d$ in conformity with a multitude of circuit variables. Generally the mathematical functions employed to compute $T_r$ and $T_d$ are functions of input voltage swing and slew rate, power supply voltages, temperature, device sizes and types. The model also includes response to various and varying load conditions and the present invention concerns the accurate modeling of load response by including a model of response to non-linear capacitance provided by gates of transistors (N2,P2,N3,P3) that are connected to the logical circuit block (L1) output being modeled. The input capacitance of a MOS transistor increases as the channel widens, so that the total input capacitance of a logical gate is a complex function of the gate voltage and depends on both devices (for a CMOS input such as those illustrated by logical circuit blocks L2 and L3). The separate consideration of circuit response to static capacitance $C_S$ and transistor gate capacitance provides a more accurate model than previously used models that produce a response only to static capacitance.

Typically, prior art models include a response only to static capacitance which may be the total of all load capacitance or an effective capacitance from a network that takes into account wiring resistance, such as the pi-network model described in the above-referenced patent application. The techniques of the present invention may also be used with network models, but the illustration provided herein is one in which the transition time and delay time of a logical circuit block is modeled directly from input variables that ignore resistance and consider only the totals of the various capacitances.

One model in accordance with the present invention models the response of the circuit to N-channel device gate capacitance and a separate response to P-channel device gate capacitance. These capacitances might be obtained by totaling all of the gate capacitances of the N-channel devices (N2 and N3) in the connected inputs of logical circuit blocks L2 and L3 to generate a total NFET gate capacitance $C_N$ and all of the gate capacitances of the P-channel devices (P2 and P3) in the connected inputs of logical circuit blocks L2 and L3 to generate a total NFET gate capacitance $C_P$. The illustration depicts two inputs connected to the output of circuit block L1, but a circuit may be loaded by any number of connected circuit inputs and is also not restricted to a particular configuration of circuit inputs. For example, an NMOS circuit (as opposed to the depicted CMOS circuit) would include a single N-channel gate connection per input.

The model also includes a response to the total of all static shunt capacitance $C_S$ not due to the input gate capacitances of logical circuit blocks L2 and L3, such as output capacitances, wire capacitances and other interconnect capacitances. The representative static capacitance is included in the transition time and delay time model along with, but separate from the transistor gate capacitances. The result is that the dependence of the capacitive effect of the gate connections can be modeled more accurately for: the two different edges of signal transition, the device temperatures and other factors.

The model is generated by measuring (or simulating using precise analog simulation tools) logical circuit block L1 output behavior (transition time and delay time) at various sampling points of the input variables (temperature, input slew rate, power supply voltage, static load capacitance, N-channel device transistor load capacitance, P-channel transistor gate load capacitance (or combined gate-load capacitance), etc.) and curve-fitting the transition time and delay time equations to the measured data, or generating a lookup-table model of the measured data.

The transition time and delay time equations may be expressed as follows:

$$T_r = f1(C_S, C_N, C_P, \ldots)$$

$$T_d = f2(C_S, C_N, C_P, \ldots)$$

Where $C_S$=total of all static capacitances connected to the output of logical circuit block L1, $C_N$=total of all N-channel input capacitances connected, and $C_P$=total of all P-channel input capacitances connected. The totals may also be adjusted; for example, the P-channel and N-channel totals may be reduced to take into account wire resistance $R_W$ or other effects, and the static capacitance may also be adjusted as well. The primary feature of the models of the present invention is the separate treatment of transistor gate capacitance.

An alternative model expresses the transition time and delay time in terms of the ratio of N-channel to P-channel transistor gate capacitances:

$$T_r = f3(C_S, C_T, R_{N/P}, \ldots)$$

$$T_d = f4(C_S, C_T, R_{N/P}, \ldots)$$

Where $C_T$ may be either of the gate capacitances or their sum and $R_{N/P} = C_N/C_P$.

Another alternative is to express the transistor gate capacitance as a fraction (or a separate fraction for N-channel and P-channel devices) of the static capacitance, yielding:

$$T_r = f5(C_S, R_{T/S}, \ldots)$$

$$T_d = f6(C_S, R_{T/S}, \ldots)$$

Where $R_{T/S}$ is the ratio of the transistor gate capacitances to the static capacitances, or $$T_r = f7(C_S, R_{N/S}, R_{P/S} \ldots)$$

$$T_d = f8(C_S, R_{N/S}, R_{P/S} \ldots)$$

Where $R_{N/S}$ and $R_{P/S}$ are the ratios of the individual (N or P) transistor gate capacitances to the static capacitances, respectively.

In essence, all of the above models are equivalent to either the model treating N and P channel devices together (as one lumped transistor gate capacitance) or the model that treats them separately. The exemplary models presented above represent a reformulation of the delay time and transition time model in various combinations depending on desired input variables. While they are illustrative of the method of the present invention, they are not intended to be exhaustive or otherwise limiting.

Figure 3:
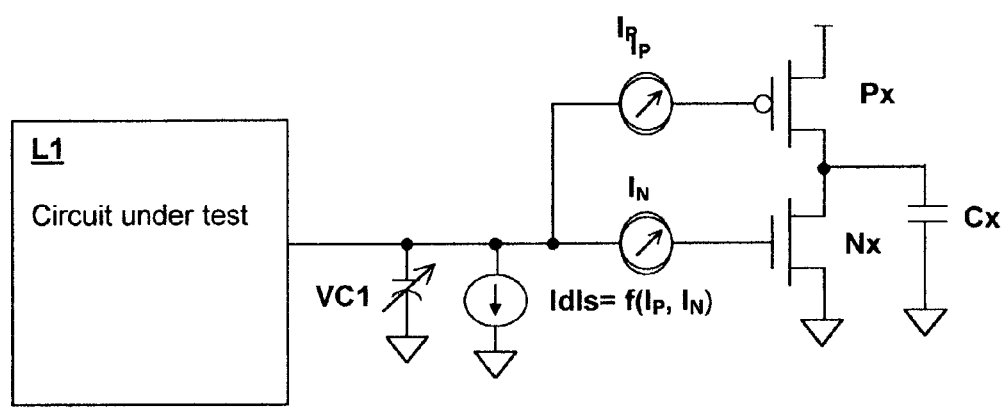
FIG. 3 is a schematic diagram of a measurement circuit that can be used to determine characteristics of a circuit model in accordance with an embodiment of the present invention.

Referring now to FIG. 3, a circuit that may be used in an analog simulator or for other measurement purposes to determine the characteristics of the model for transition time and delay time is shown. A circuit simulator such as SPICE may be used to simulate the circuit of FIG. 3, in order to determine the transition time and delay time functions of logical circuit block L1. Loading transistors Nx and Px have a channel width set to a convenient value of "gate capacitance" and capacitance $C_x$ is set to represent a typical load at the output of transistors Nx and Px. Variable capacitor VC1 represents the static capacitance $C_s$ and can be set to different values including zero to simulate variation over the wire capacitance variable in the logical circuit models. A current meter ($I_P$, $I_N$) is inserted into each transistor gate circuit. The current meters can then control current dependent shunt current source IdIs, which is used to multiply the gate current of the transistors in order to simulate varying the individual gate capacitances of each transistor type (N or P channel). If shunt current IdIs is set to a value of $-1*(I_P + I_N)$, the transistors are effectively removed leaving only capacitor VC1. If the capacitance of capacitor VC1 is set to zero, and shunt current IdIs is set to a value of $-1*(I_P - I_N)$ then a measurement can be taken for zero wire capacitance and, $C_P = 0$ and $C_N = 2$ * NFET capacitance. In general, if shunt current IdIs is set to a value of $(k_P I_P + k_N I_N)$, where $k_P$, $k_N$ are variable coefficients, then the P-channel transistor gate capacitance is effectively multiplied by $(1+k_P)$ and the N-channel transistor gate capacitance is effectively multiplied by $(1+k_N)$, and $k_P$ and $k_N$ can be swept independently over a range of interest without having to modify the model.

Figure 4:
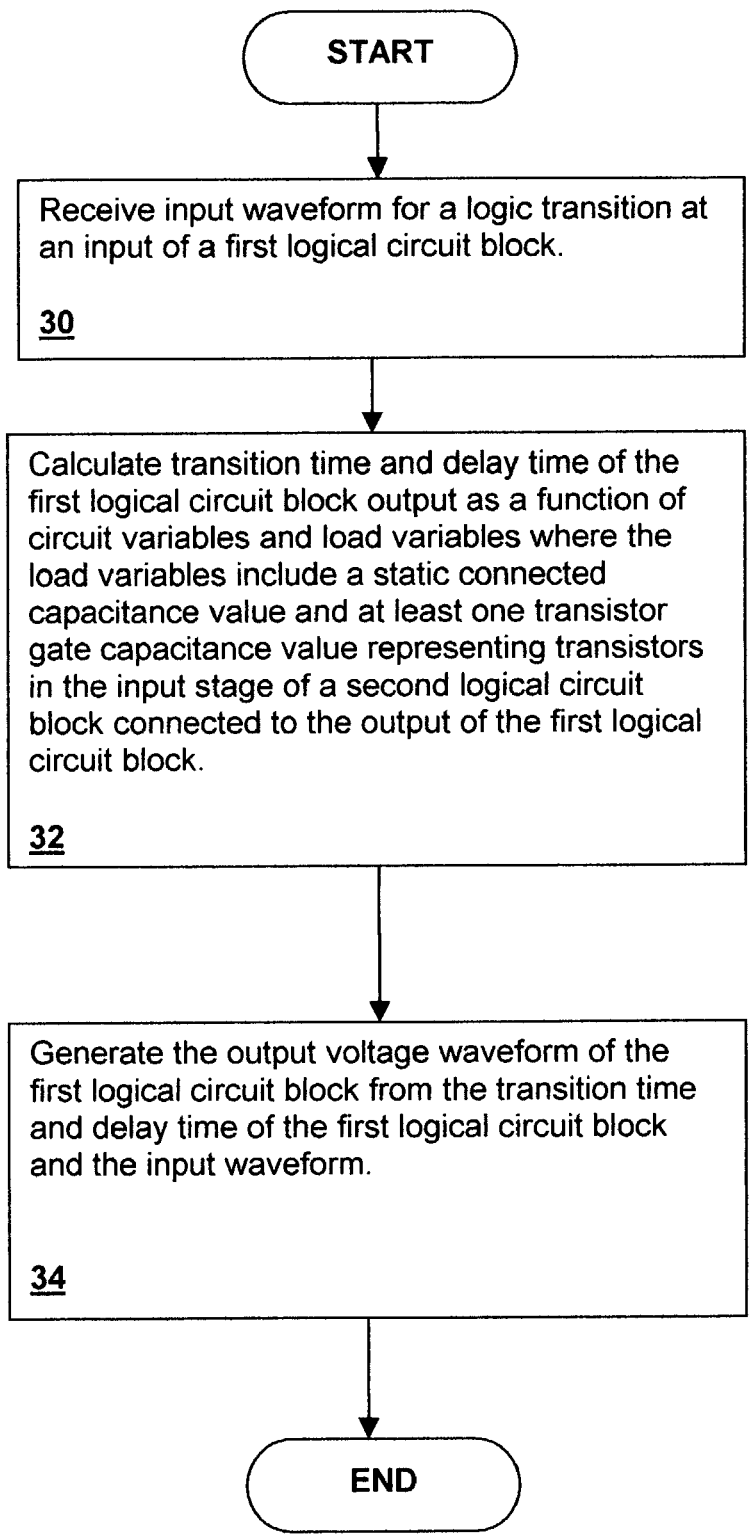
FIG. 4 is a flow chart of a method in accordance with an embodiment of the present invention.

Referring now to FIG. 4, a method in accordance with an embodiment of the present invention is depicted in a flowchart. Timing analysis generates an input waveform for a logic transition at an input of a first logical circuit block. The input waveform (which may be just the 50% voltage time point) is received by the method (step 30). Next, the method calculates the transition time and delay time of the first logical circuit block output as a function of circuit variables and load variables, where the load variables include a static connected capacitance value and at least one transistor gate capacitance value representing transistors in the input stage of a second logical circuit block connected to the output of the first logical circuit block (step 32). Finally, an output voltage waveform of the first logical circuit block is generated from the transition time and delay time of the first logical circuit block and the input waveform (step 34).

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for determining coefficients for a logical circuit block model, comprising:
   determining a value of a simulated gate current conducted from a logical circuit block output into a gate of a loading circuit transistor during simulations of performance of said logical circuit block;
   simulating a current-dependent current source conducted from said logical circuit block output to a return path during said simulations of performance;
   setting a magnitude of the current-dependent current source to a value computed according to a model from the determined value of the simulated gate current, wherein the magnitude of the current-dependent current source is set in proportion to the determined value of the simulated gate current according to a proportion;
   repeatedly calculating a logical circuit block performance value while varying the proportion in order to simulate different sizes of the loading circuit transistor;
   computing said coefficients from a result of the calculating, wherein the coefficients are coefficients that relate the logical circuit block performance value to a capacitance of said gate of said loading circuit transistor from a result of said calculating and said varying; and
   storing said coefficients in a computer memory.

2. The method of claim 1, further comprising second simulating an independently variable shunt capacitance connected from said logical circuit block output to a return path, whereby effects of a static loading capacitance on said logical circuit block performance value is simulated.

3. A method for modeling, in a computer system, the behavior of a logical circuit block, the method comprising:

first calculating in said computer system a transition time of said logical circuit block as a first mathematical function of a transistor gate capacitance of one or more logical circuit inputs connected to an output of said logical circuit block and a static load capacitance value, wherein said first mathematical function is separately dependent on said transistor gate capacitance and said static load capacitance value;

second calculating in said computer system a delay time of said logical circuit block as a second mathematical function of said transistor gate capacitance and said static load capacitance value, wherein said second mathematical function is separately dependent on said transistor gate capacitance and said static load capacitance value; and displaying by said computer system, a result of at least one of said first and second calculating, and wherein coefficients of said first and second mathematical function with respect to said transistor gate capacitance are determined in advance of said first calculating and said second calculating by determining a value of a simulated gate current conducted from a logical circuit block output into a gate of a loading circuit transistor of said one or more logical circuit inputs during simulations of said transition time and said delay time of said logical circuit block, and further simulating a current-dependent current source conducted from said output of said logical circuit block to a return path during said simulations of said transition time and said delay time, setting a magnitude of the current-dependent current source to a value computed according to a model from the determined value of the simulated gate current, varying a proportion of the model relating the magnitude of the current-dependent current source to the determined value of the simulated gate current to simulate different sizes of the loading circuit transistor while determining said transition time and said delay time, and calculating said coefficients from a result of said varying and said determining said transition time and said delay time.

4. A workstation computer system including a memory for storing program instructions and data, and a processor for executing said program instructions, and wherein said program instructions comprise program instructions for:

first calculating a transition time of said logical circuit block as a first mathematical function of a transistor gate capacitance of one or more logical circuit inputs connected to an output of said logical circuit block and a static load capacitance value, wherein said first mathematical function is separately dependent on said transistor gate capacitance and said static load capacitance value;

second calculating delay time of said logical circuit block as a second mathematical function of said transistor gate capacitance and said static load capacitance value, wherein said second mathematical function is separately dependent on said transistor gate capacitance and said static load capacitance value; and displaying a result of at least one of said first and second calculating, and wherein said program instructions further comprise additional program instructions for calculating coefficients of said first and second mathematical function with respect to said transistor gate capacitance by determining a value of a simulated gate current conducted from a logical circuit block output into a gate of a loading circuit transistor of said one or more logical circuit inputs during simulations of said transition time and said delay time of said logical circuit block, and further simulating a current-dependent current source conducted from said output of said logical circuit block to a return path during said simulations of said transition time and said delay time, setting a magnitude of the current-dependent current source to a value computed according to a model from the determined value of the simulated gate current, varying a proportion of the model relating the magnitude of the current-dependent current source to the determined value of the simulated gate current to simulate different sizes of the loading circuit transistor while determining said transition time and said delay time, and calculating said coefficients from a result of said varying and said determining said transition time and said delay time.

5. A computer program product comprising a computer-readable storage medium encoding program instructions and data for execution on a general-purpose computer system, wherein said program instructions comprise program instructions for:

first calculating a transition time of said logical circuit block as a first mathematical function of a transistor gate capacitance of one or more logical circuit inputs connected to an output of said logical circuit block and a static load capacitance value, wherein said first mathematical function is separately dependent on said transistor gate capacitance and said static load capacitance value;

second calculating delay time of said logical circuit block as a second mathematical function of said transistor gate capacitance and said static load capacitance value, wherein said second mathematical function is separately dependent on said transistor gate capacitance and said static load capacitance value;

displaying a result of at least one of said first and second calculating;

calculating coefficients of said first and second mathematical function with respect to said transistor gate capacitance by determining a value of a simulated gate current conducted from a logical circuit block output into a gate of a loading circuit transistor of said one or more logical circuit inputs during simulations of said transition time and said delay time of said logical circuit block;

simulating a current-dependent current source conducted from said output of said logical circuit block to a return path during said simulations of said transition time and said delay time;

setting a magnitude of the current-dependent current source to a value computed from the determined value of the simulated gate current according to a proportion;

varying the proportion to simulate different sizes of the loading circuit transistor while determining said transition time and said delay time; and calculating said coefficients from a result of said varying and said determining said transition time and said delay time.

* * * * *